(12) United States Patent
Wang et al.

(10) Patent No.: US 10,872,878 B2
(45) Date of Patent: Dec. 22, 2020

(54) PACKAGING METHODS FOR SEMICONDUCTOR DEVICES, PACKAGED SEMICONDUCTOR DEVICES, AND DESIGN METHODS THEREOF

(71) Applicant: Taiwan Semiconductor Manufacturing Company, Ltd., Hsin-Chu (TW)

(72) Inventors: Chuei-Tang Wang, Taichung (TW); Monsen Liu, Zhudong Township (TW); Chen-Hua Yu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 17 days.

(21) Appl. No.: 15/184,784

(22) Filed: Jun. 16, 2016

(65) Prior Publication Data

US 2016/0293576 A1    Oct. 6, 2016

Related U.S. Application Data

(63) Continuation of application No. 14/157,364, filed on Jan. 16, 2014, now Pat. No. 9,396,300.

(51) Int. Cl.
*H01L 25/065* (2006.01)
*H01L 23/00* (2006.01)
(Continued)

(52) U.S. Cl.
CPC ........ *H01L 25/0652* (2013.01); *G06F 30/394* (2020.01); *H01L 24/19* (2013.01); *H01L 24/24* (2013.01); *H01L 24/82* (2013.01); *H01L 24/96* (2013.01); *H01L 24/97* (2013.01); *H01L 25/50* (2013.01); *H01L 21/568* (2013.01); *H01L 23/49811* (2013.01); *H01L 23/5389* (2013.01); *H01L 24/08* (2013.01); *H01L 2224/04105* (2013.01); *H01L 2224/05571* (2013.01); *H01L 2224/08145* (2013.01); *H01L 2224/12105* (2013.01); *H01L 2224/13025* (2013.01); *H01L 2224/16145* (2013.01); *H01L 2224/16225* (2013.01); *H01L 2224/16235* (2013.01); *H01L 2224/24137* (2013.01); *H01L 2224/32145* (2013.01); *H01L 2224/32225* (2013.01); *H01L 2224/73259* (2013.01); *H01L 2224/73267* (2013.01); *H01L 2224/81005* (2013.01);
(Continued)

(58) Field of Classification Search
CPC .............................. H01L 25/065; H01L 25/00
USPC .................. 257/727, 773, 678; 438/110, 121
See application file for complete search history.

(56) References Cited

U.S. PATENT DOCUMENTS 5,111,278 A   5/1992   Eichelberger
6,528,871 B1  3/2003   Tomita
(Continued)

FOREIGN PATENT DOCUMENTS

KR        20140002458        1/2014

*Primary Examiner* — Sheng-Bai Zhu
(74) *Attorney, Agent, or Firm* — Slater Matsil, LLP (57) ABSTRACT

Packaging methods for semiconductor devices, packaged semiconductor devices, and design methods thereof are disclosed. In some embodiments, a method of packaging a plurality of semiconductor devices includes providing a first die, and coupling second dies to the first die. An electrical connection is formed between the first die and each of the second dies. A portion of each of the electrical connections is disposed between the second dies.

20 Claims, 7 Drawing Sheets

(51) Int. Cl.
*G06F 30/394* (2020.01)
*H01L 25/00* (2006.01)
*H01L 21/56* (2006.01)
*H01L 23/538* (2006.01)
*H01L 23/498* (2006.01)

(52) U.S. Cl.
CPC ............... *H01L 2224/81192* (2013.01); *H01L 2224/82005* (2013.01); *H01L 2224/92224* (2013.01); *H01L 2224/92244* (2013.01); *H01L 2224/97* (2013.01); *H01L 2225/06544* (2013.01); *H01L 2225/06586* (2013.01); *H01L 2924/00011* (2013.01); *H01L 2924/18161* (2013.01)

(56) References Cited

U.S. PATENT DOCUMENTS

| | | | |
|---|---|---|---|
| 7,078,788 B2 | 7/2006 | Vu et al. | |
| 7,176,506 B2 | 2/2007 | Beroz et al. | |
| 7,312,405 B2 * | 12/2007 | Hsu | H01L 23/5389 174/262 |
| 7,589,282 B2 * | 9/2009 | Yamada | G02B 6/43 174/255 |
| 7,727,806 B2 | 6/2010 | Uhland et al. | |
| 8,669,140 B1 * | 3/2014 | Muniandy | H01L 25/105 257/774 |
| 8,703,539 B2 | 4/2014 | Yu et al. | |
| 2005/0133929 A1 * | 6/2005 | Howard | H01L 23/5385 257/774 |
| 2007/0164418 A1 * | 7/2007 | Brunnbauer | H01L 25/18 257/685 |
| 2008/0211081 A1 * | 9/2008 | Lee | H01L 23/481 257/691 |
| 2008/0315372 A1 * | 12/2008 | Kuan | H01L 21/568 257/659 |
| 2009/0155957 A1 | 6/2009 | Chen et al. | |
| 2011/0031634 A1 * | 2/2011 | Pagaila | H01L 21/568 257/777 |
| 2011/0037157 A1 * | 2/2011 | Shin | H01L 23/49833 257/686 |
| 2011/0147917 A1 * | 6/2011 | England | H01L 23/3677 257/692 |
| 2011/0159639 A1 * | 6/2011 | Yee | H01L 21/568 438/109 |
| 2011/0233764 A1 | 9/2011 | Chang et al. | |
| 2011/0241215 A1 * | 10/2011 | Sankman | H01L 21/6835 257/773 |
| 2011/0291283 A1 * | 12/2011 | Chi | H01L 23/3128 257/773 |
| 2014/0159247 A1 * | 6/2014 | Lyne | H01L 25/065 257/774 |
| 2015/0200154 A1 * | 7/2015 | Choi | H01L 23/481 257/777 |

* cited by examiner

PACKAGING METHODS FOR SEMICONDUCTOR DEVICES, PACKAGED SEMICONDUCTOR DEVICES, AND DESIGN METHODS THEREOF

PRIORITY CLAIM

This application is a continuation of U.S. patent application Ser. No. 14/157,364, filed on Jan. 16, 2014, and entitled "Packaging Methods for Semiconductor Devices, Packaged Semiconductor Devices, and Design Methods Thereof," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, as examples.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to methods of packaging semiconductor devices and structures thereof. Some embodiments are related to design methods for packaged semiconductor devices. The packaged semiconductor devices and designs include through-vias that are disposed between a plurality of dies that are stacked on another die. The through-vias may be disposed within a molding compound, or the through-vias may be disposed within a die or an interposer, which will be described further herein.

Figure 1:
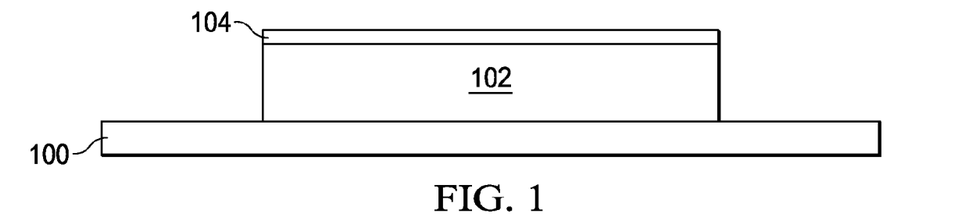
FIGS. 1 through 7 illustrate cross-sectional views of a method of packaging semiconductor devices at various stages in accordance with some embodiments.

FIGS. 1 through 7 illustrate cross-sectional views of a method of packaging semiconductor devices at various stages in accordance with some embodiments. Referring first to FIG. 1, there is shown a first die 102. The first die 102 is adapted to perform a first function in some embodiments. For example, the first die 102 may comprise a memory device in some embodiments. Alternatively, the first die 102 may be adapted to perform other types of functions. The first die 102 is manufactured using a relatively advanced wafer node in some embodiments, for example.

The first die 102 includes an input/output region 104 disposed proximate a surface of one side of the first die 102. The input/output region 104 may include a plurality of connectors such as contact pads (not shown) disposed on a surface thereof. The input/output region 104 is also referred to herein, e.g., in some of the claims, as an input/output interface. The contact pads may be coupled to internal wiring of the first die 102, such as to vias and/or conductive lines in metallization layers or polysilicon layers of the first die 102, as examples, also not shown. The connectors of the input/output region 104 are disposed primarily in a central region of the first die 102 in some embodiments. Alternatively, the connections of the input/output region 104 may be disposed in other regions of the first die 102 or over an entire surface of the first die 102. The input/output region 104 comprises a wide input/output (I/O) interface in some embodiments, for example. Connections of the I/O interface may comprise a pitch of about 1 µm to about 300 µm, and the I/O count may comprise a number of about 100 to about 1,000 or greater, in some embodiments, as examples. Alternatively, the I/O interface of the input/output region 104 may comprise other pitches and I/O count numbers.

The first die 102 is coupled to a carrier 100, also shown in FIG. 1. The first die 102 may be coupled to the carrier 100 using an adhesive or glue, for example. The carrier 100 may comprise a wafer such as a semiconductor wafer, or the carrier 100 may comprise an organic substrate or other types of substrates. The carrier 100 comprises a sacrificial component that will be removed after the first die 102 is packaged with other die, such as second dies 132a and 132b shown in FIG. 4, to be described further herein. The carrier 100 may later be cleaned and used to package other semiconductor devices, for example. Alternatively, the carrier 100 may be discarded after the packaging process.

The first die 102 comprises a die that will be packaged with a plurality of second dies (not shown in FIG. 1; see second dies 132a and 132b shown in FIG. 4) in accordance with some embodiments.

In accordance with some embodiments, a plurality of the first dies 102 is formed over the carrier 100, not shown. A plurality of the first dies 102 may be simultaneously packaged over the carrier 100 and later singulated to form a plurality of packaged semiconductor devices, for example.

Figure 2:
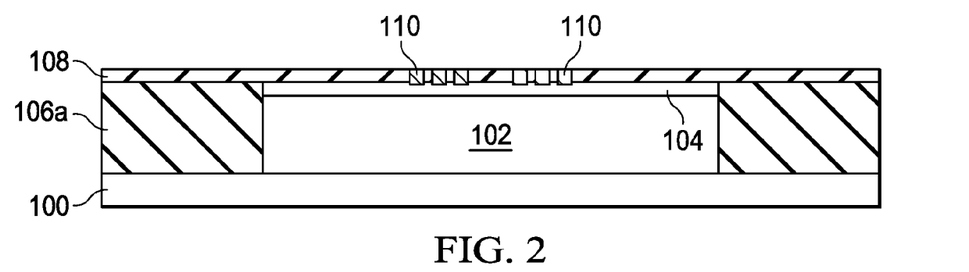

A molding compound 106a is formed over the first die 102, as shown in FIG. 2. The molding compound 106a comprises a molding material and may comprise epoxy, an organic polymer, or a polymer with a silica-based filler added, as examples. In some embodiments, the molding compound 106a comprises a liquid molding compound (LMC) that is a gel type liquid when applied. Alternatively, the molding compound 106a may comprise other insulating materials. If the molding compound 106a extends over a top surface of connectors within the input/output region 104 of the first die 102, the molding compound 106a is removed from over the input/output region 104, for example. The molding compound 106a is formed around the first die 102 in some embodiments.

An insulating material 108 and interconnects 110 are disposed over the first die 102 and the molding compound 106a, also shown in FIG. 2. The interconnects 110 may comprise a post-passivation interconnect (PPI) structure, and the insulating material 108 may comprise polybenzoxazole (PBO) in some embodiments, for example. Alternatively, the interconnects 110 and insulating material 108 may comprise other materials.

Figure 3:
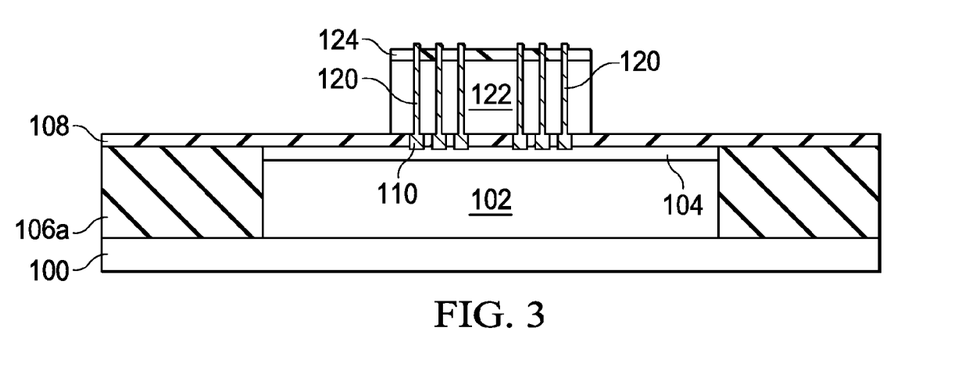

A die 122 is coupled over the first die 102, as shown in FIG. 3. The die 122 is also referred to herein as a third die 122, e.g., in some of the claims. The die 122 comprises an input/output die in some embodiments, for example. The die 122 includes a plurality of through-vias 120 formed therein. An insulating material 124 may be disposed on one side of the die 122. Ends of the through-vias 120 or contact pads coupled to the through-vias 120 are exposed through the insulating material 124 for making electrical connections to the die 122. Opposite ends of the through-vias 120 are coupled to the interconnects 110 disposed over the first die 102. The through-vias 120 are pre-formed in the die 122 in accordance with some embodiments. The through-vias 120 extend from one side of the die 122 to the other side, and provide vertical electrical connections that are coupled to the first die 102. The through-vias 120 are connected at one end to the interconnects 110 disposed over and coupled to the first die 102 in some embodiments.

The through-vias 120 comprise copper or a copper alloy in some embodiments. The through-vias 120 may include a liner, barrier layer, seed layer, and a conductive fill material in some embodiments. Alternatively, the through-vias 120 may comprise other materials and material layers. The through-vias 120 are formed on a relatively narrow pitch in some embodiments. For example, the through-vias 120 may be formed on a minimum features size or critical dimension (CD) of the third die 122, in some embodiments. The through-vias 120 may comprise a width of about 1 µm to about 200 µm and a pitch of about 1 µm to about 300 µm in some embodiments, as examples. The through-vias 120 may comprise a shape of a circle, oval, square, rectangle, or other shapes in a top view, for example, not shown. Alternatively, the through-vias 120 may comprise other shapes and dimensions.

The through-vias 120 comprise a portion of electrical connections that are formed between the first die 102 and each of the second dies 132a and 132b in accordance with some embodiments. The through-vias 120 comprise vertical electrical connections in some embodiments, for example.

The die 122 comprises an input/output controller in some embodiments. In some embodiments, the die 122 comprises a low end wafer node, such as a bulk planar node, for example. The through-vias 120 may comprise through-substrate vias (TSVs) that are disposed within the die 122, for example. The through-vias 120 or contact pads coupled to the through-vias 120 may be coupled to interconnects 120 using a metal-to-metal bonding process, such as a copper-to-copper bonding process, e.g., in embodiments wherein the through-vias 120 or contacts pads coupled to the through-vias 120 and the interconnects 120 comprise copper or a copper alloy, as another example. The through-vias 120 comprise vertical electrical connections disposed within the die 122 that are electrically coupled to the input/output regions 104 of the first die 102 in some embodiments, for example.

In embodiments wherein a plurality of the first dies 102 are packaged simultaneously over the carrier 100, a die 122 is coupled to each of the first dies 102. In some embodiments, two or more dies 122 may be coupled to the first die 102, not shown.

Figure 4:
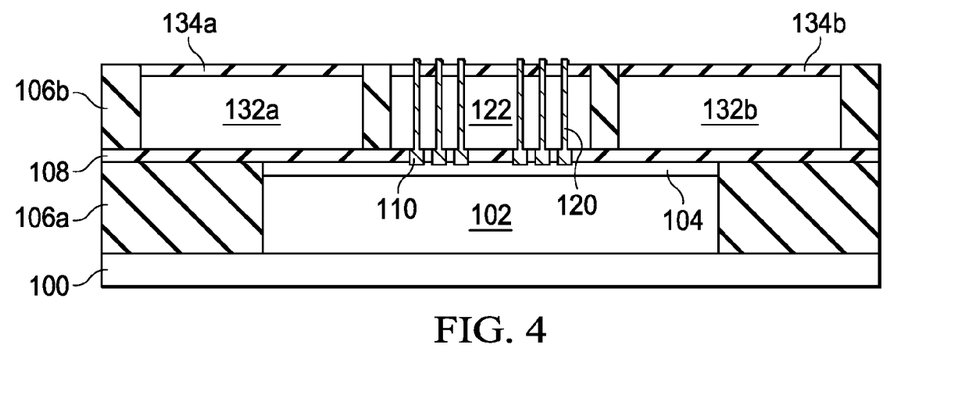

Next, a plurality of second dies 132a and 132b are coupled to the first die 102, as shown in FIG. 4. Only two second dies 132a and 132b are shown in the drawings; however, alternatively, three or more second dies 132a and 132b may be coupled to each first die 102, not shown. The third die 122 that includes the through-vias 120 is coupled between two of the plurality of second dies 132a and 132b. Each of the second dies 132a and 132b may include an insulating material 134a and 134b, respectively, disposed proximate a surface of the second dies 132a and 132b. Connectors (not shown) such as contacts, contact pads, and/or bond pads may be disposed within the insulating materials 134a and 134b for making electrical connections to the second dies 132a and 132b.

In some embodiments, the second dies 132a and 132b are adapted to perform a second function, the second function being different than the first function of the first die 102. Alternatively, the second dies 132a and 132b may comprise a similar or the same function as the first die 102 in other embodiments. In some embodiments, the first die 102 and the plurality of second dies 132a and 132b comprise functions such that they function as a system-on-a-chip (SOC) when the first die 102 and the plurality of second dies 132a and 132b are packaged together.

In some embodiments, the second dies 132a and 132b comprise processors. The second dies 132a and 132b comprise advanced node integrated circuits in some embodiments. In some embodiments, the second dies 132a and 132b may comprise multiple-gate field effect transistors (MUGFETs), and may comprise FinFETs, for example. Alternatively, the second dies 132a and 132b may comprise other types of devices.

In some embodiments, a single second die (not shown) to be packaged with the first die 102 is re-designed so that the single second die comprises the plurality of second dies 132a and 132b, so that the third die 122 containing the through-vias 120 can be placed between two of the plurality of second dies 132a and 132b, to be described further herein.

The third die 122 comprising the through-vias 120 is coupled between two of the plurality of second dies 132a and 132b in accordance with some embodiments. Portions of the first die 102, e.g., interconnects 110, are electrically coupled to the through-vias 120 in the third die 120 in accordance with some embodiments.

A molding compound 106b is disposed between the second dies 132a and 132b and the third die 122, also shown in FIG. 4. The molding compound 106b is formed around the second dies 132a and 132b and the third die 122, for example. The molding compound 106b comprises a similar material as described for molding compound 106a. The molding compounds 106a and 106b are also referred to herein as first or second molding compounds 106a or 106b, depending on the order of introduction, e.g., in some of the claims. The molding compound 106b is disposed around the second dies 132a and 132b and the portion of the plurality of electrical connections (e.g., the through-vias 120 within the third die 122) disposed between the second dies 132a and 132b in some embodiments, for example.

Figure 5:
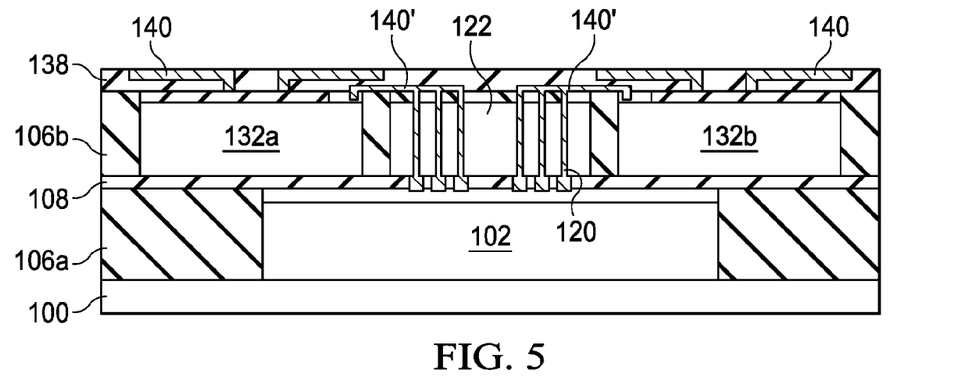

An insulating material 138 and interconnects 140 and 140' are formed over the plurality of second dies 132a and 132b and the third die 122, as shown in FIG. 5. The insulating material 138 comprises one or more insulating material layers and/or passivation layers. The interconnects 140 and 140' comprise conductive lines and/or conductive vias formed within the insulating material 138. The insulating material 138 and interconnects 140 and 140' comprise a PPI structure and/or a redistribution layer (RDL) in some embodiments. Alternatively, the insulating material 138 and interconnects 140 and 140' may comprise other types of connection structures.

The insulating material 138 and interconnects 140 and 140' comprise horizontal electrical connections in some embodiments that are formed over the molding compound 106b, the second dies 132a and 132b, and the third die 122, in some embodiments. The horizontal electrical connections are disposed on a side of the packaged semiconductor device 150 (see FIG. 7) proximate the second dies 132a and 132b in accordance with some embodiments. Portions of the interconnects 140' (e.g., the horizontal electrical connections) are coupled to the through-vias 120 of the third die 122. In some embodiments, the insulating material 138 and interconnects 140 include fan-out regions so that electrical connections can be made to the packaged semiconductor device 150 on a wider footprint than contacts, contact pads, or bond pads of the first die 102 and second dies 132a and 132b, for example.

Figure 6:
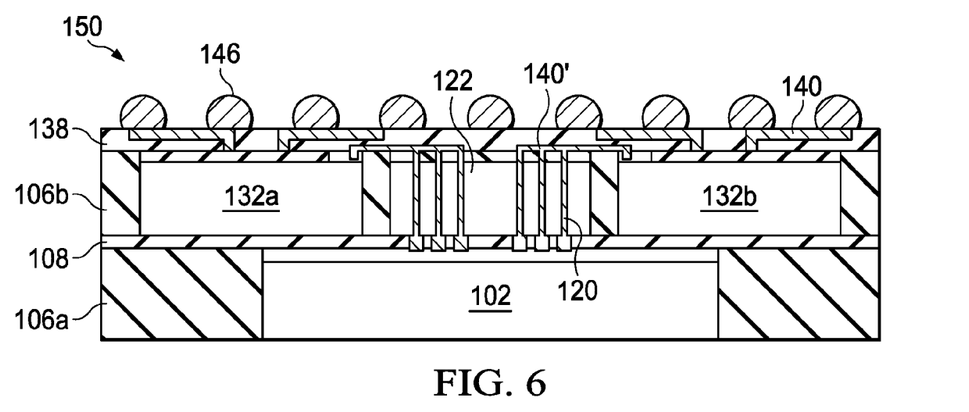

The carrier 100 is removed, and a plurality of conductors 146 are then coupled to the interconnects 140 in some embodiments, as shown in FIG. 6. The conductors 146 are formed over and are coupled to portions of the horizontal electrical connections, for example. The conductors 146 may comprise a eutectic material such as solder that is coupled to contact pads or bond pads of the interconnects 140, for example. The conductors 146 may comprise a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductors 146 such as solder balls may be formed from SnCu compounds as well, without the use of silver (Ag). Alternatively, lead-free solder connectors may include tin and silver, Sn—Ag, without the use of copper. The conductors 146 may be one among an array of the conductors 146 formed as a grid, referred to as a "ball grid array" or "BGA". The conductors 146 may alternatively be arranged in other shapes. The conductors 146 may also comprise non-spherical conductive connectors, for example. In some embodiments, the conductors 146 are not included.

Figure 7:
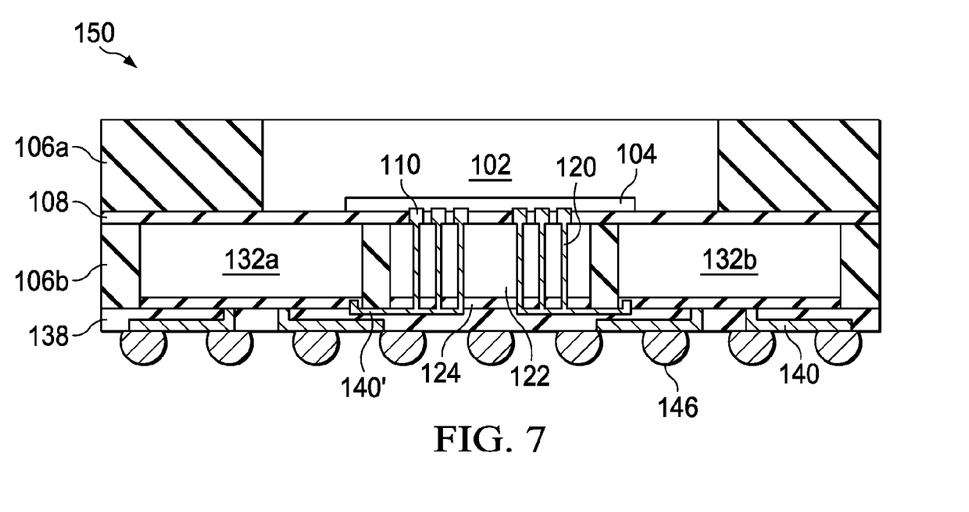

The packaged semiconductor device 150 is then inverted, as shown in FIG. 7. A plurality of the packaged semiconductor devices 150 may be singulated by separating them along scribe lines using a die saw, in some embodiments. The packaged semiconductor device 150 includes the first die 102 that is packaged with the second dies 132a and 132b. The through-vias 120 in the third die 122 provide vertical electrical connections for the packaged semiconductor device 150. The interconnects 140 and 140' provide horizontal electrical connections for the packaged semiconductor device 150. Advantageously, because the through-vias 120 are disposed between the second dies 132a and 132b, the length of the wiring and the routing of the wiring (e.g., interconnects 140') is minimized, improving performance of the packaged semiconductor device 150.

Figure 8:
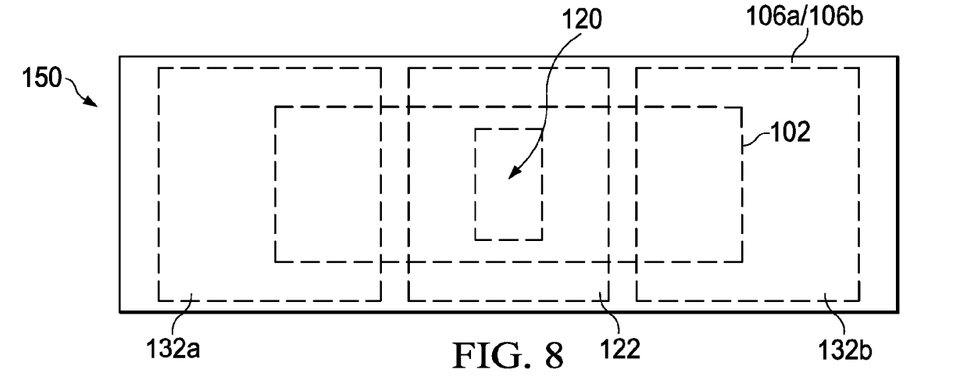
FIG. 8 is a top view of the packaged semiconductor device shown in FIG. 7.

FIG. 8 is a top view of the packaged semiconductor device 150 shown in FIG. 7. The through-vias 120 of the third die 122 are disposed between the second dies 132a and 132b.

The interconnects 110, 140 and 140' may comprise a metal such as Ti, Al, Ni, nickel vanadium (NiV), Cu, or combinations or multiple layers thereof, as examples. The interconnects 110, 140 and 140' may be formed using electrolytic plating, electroless plating, sputtering, chemical vapor deposition methods, and/or photolithography processes, for example. The interconnects 110, 140 and 140' may comprise a single layer or multiple layers using an adhesion layer of Ti, TiW, Cr, or other materials, for example. The insulating materials 108, 124, and 138 may comprise a polymer, such as an epoxy, polyimide, benzocyclobutene (BCB), PBO, and the like, although other relatively soft, often organic, dielectric materials may also be used. Spin coating or other commonly used formation methods may be used to apply the insulating materials 108, 124, and 138, for example. Alternatively, the interconnects 110, 140 and 140' and the insulating materials 108, 124, and 138 may comprise other materials and may be formed using other methods.

Figure 9:
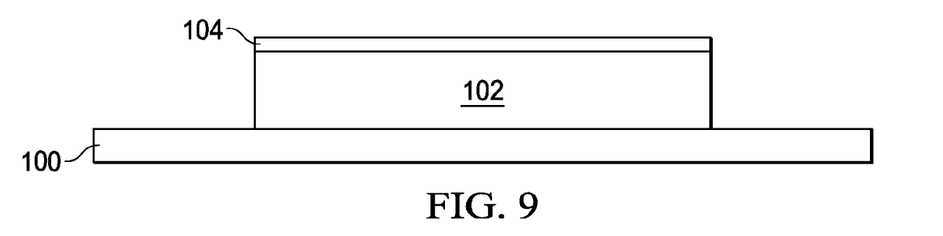
FIGS. 9 through 15 illustrate cross-sectional views of a method of packaging semiconductor devices at various stages in accordance with some embodiments.
Figure 10:
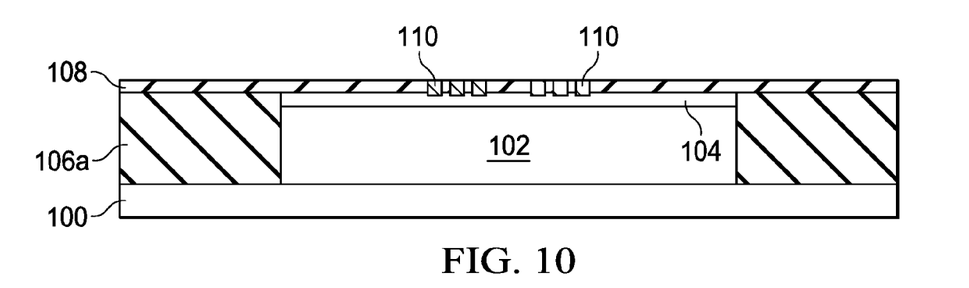

FIGS. 9 through 15 illustrate cross-sectional views of a method of packaging semiconductor devices at various stages in accordance with some embodiments. A first die 102 including an input/output region 104 is coupled to a carrier 100, as shown in FIG. 9. A molding compound 106a is formed around the first die 102, and an insulating material 108 and interconnects 110 are formed over the first die 102 and the molding compound 106a, as shown in FIG. 10.

Figure 11:
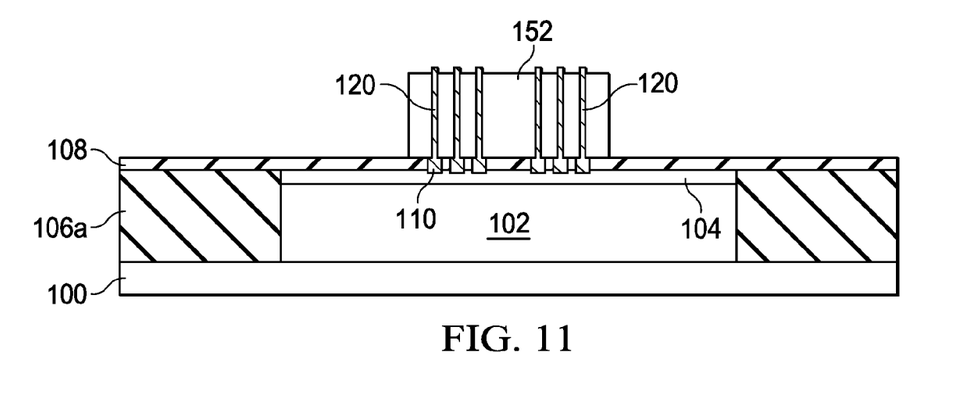

An interposer 152 is coupled over the first die 102, as shown in FIG. 11. The interposer 152 comprises a passive interposer in some embodiments, for example. The interposer 152 includes a plurality of through-vias 120 formed therein. Ends of the through-vias 120 or contacts coupled to the through-vias 120 are exposed on each side of the interposer 152 for making electrical connections to the interposer 152. The through-vias 120 are pre-formed in the interposer 152 in accordance with some embodiments. The through-vias 120 extend from one side of the interposer 152 to the other side, and provide vertical electrical connections that are coupled to the first die 102. The through-vias 120 are connected at one end to the interconnects 110 disposed over and coupled to the first die 102 in some embodiments.

Figure 12:
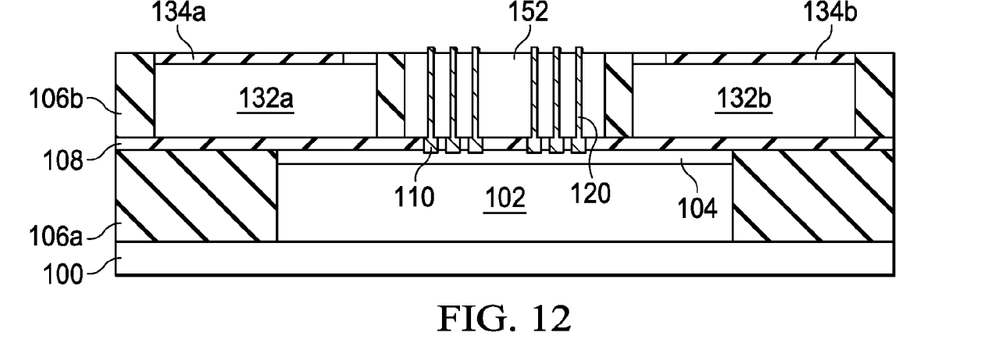
Figure 13:
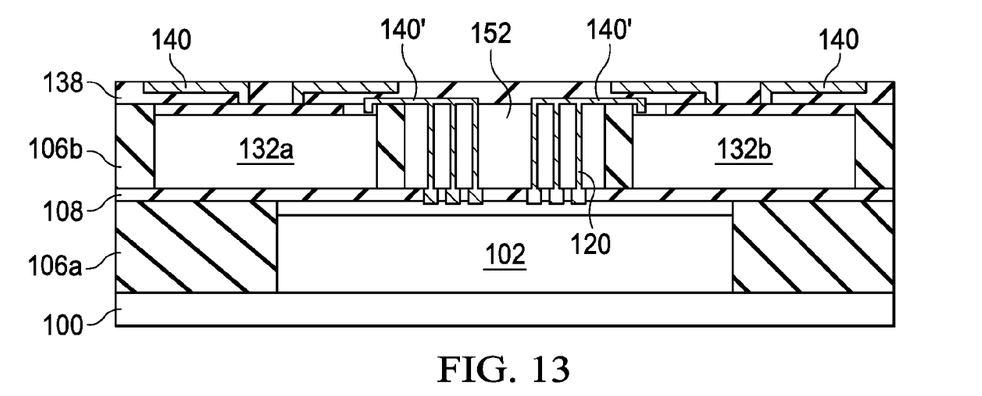
Figure 14:
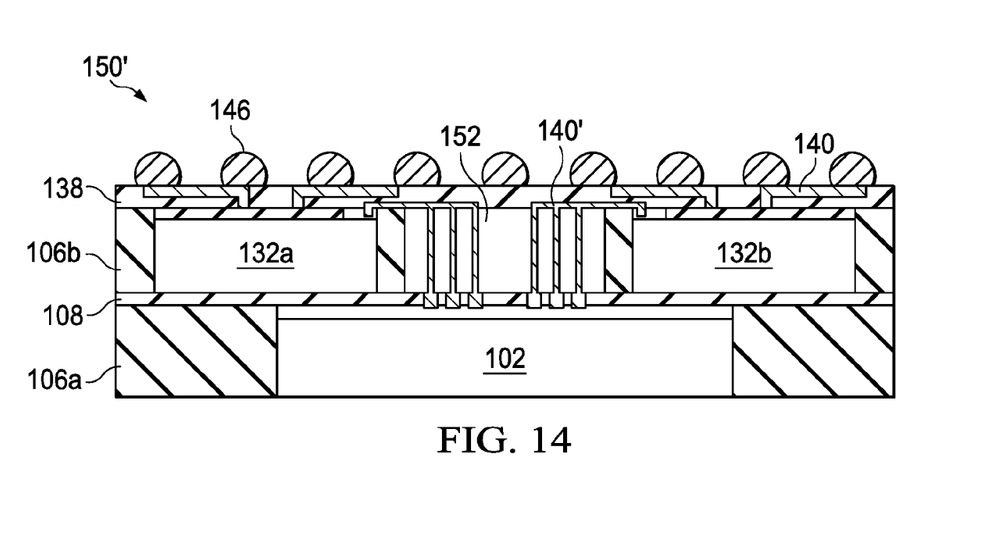

Next, a plurality of second dies 132a and 132b are coupled to the first die 102, as shown in FIG. 12. The interposer 152 that includes the through-vias 120 is coupled between two of the plurality of second dies 132a and 132b. A molding compound 106b is disposed between the second dies 132a and 132b and the interposer 152. An insulating material 138 and interconnects 140 and 140' are formed over the plurality of second dies 132a and 132b and the interposer 152, as shown in FIG. 13. A plurality of conductors 146 are then coupled to portions of the interconnects 140, as shown in FIG. 14, in some embodiments.

Figure 15:
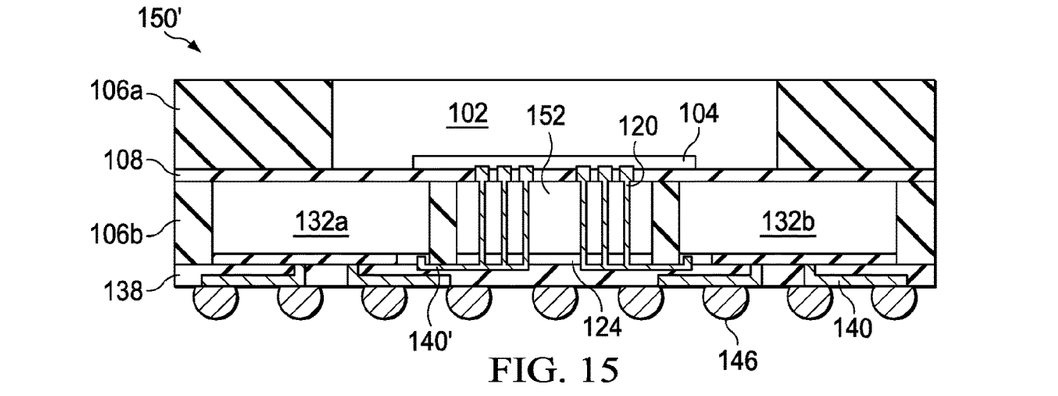
Figure 16:
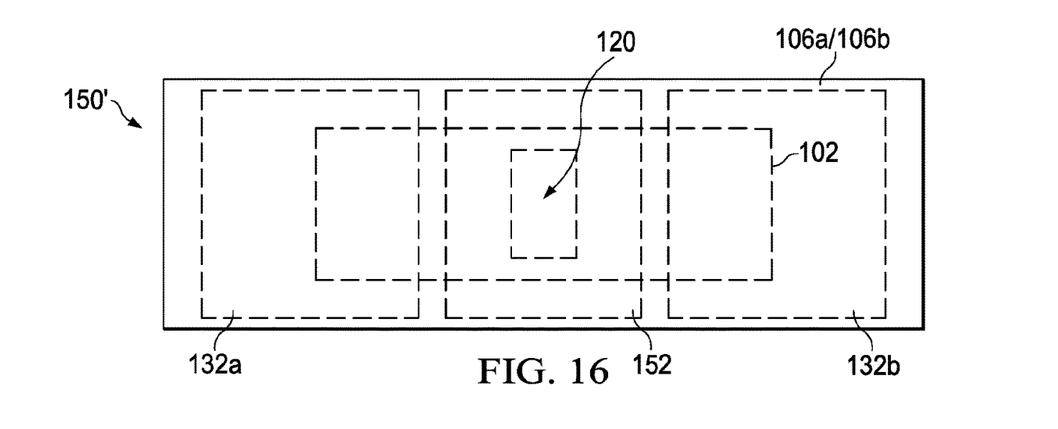
FIG. 16 is a top view of the packaged semiconductor device shown in FIG. 15.

The packaged semiconductor device 150' is then inverted, as shown in FIG. 15. A plurality of the packaged semiconductor devices 150' may be singulated by separating them along scribe lines using a die saw, in some embodiments. The packaged semiconductor device 150' includes the first die 102 that is packaged with the second dies 132a and 132b. The through-vias 120 in the interposer 152 provide vertical electrical connections for the packaged semiconductor device 150'. The interconnects 140 and 140' provide horizontal electrical connections for the packaged semiconductor device 150'. Advantageously, because the through-vias 120 are disposed within the interposer 152 between the second dies 132a and 132b, the length and routing of the wiring (e.g., interconnects 140' is minimized, improving performance of the packaged semiconductor device 150'. FIG. 16 is a top view of the packaged semiconductor device 150' shown in FIG. 15.

Figure 17:
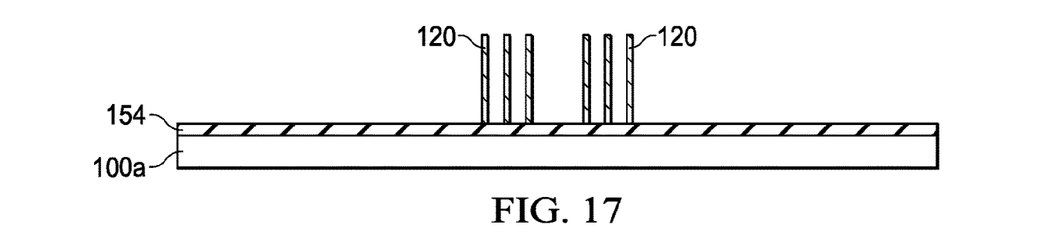
FIGS. 17 through 23 illustrate cross-sectional views of a method of packaging semiconductor devices at various stages in accordance with some embodiments.

FIGS. 17 through 23 illustrate cross-sectional views of a method of packaging semiconductor devices at various stages in accordance with some embodiments. Rather than being disposed within a third die 122 or an interposer 152 as in the previous embodiments described herein, the through-vias 120 are formed over a carrier 100a and are later encapsulated with a molding compound 106b. For example, in FIG. 17, a first carrier 100a is provided, and a seed layer 154 is formed over the carrier 100a. The seed layer 154 may comprise copper or a copper alloy formed using a sputter process, physical vapor deposition (PVD), atomic layer deposition (ALD), or other methods. A photoresist (not shown) is formed over the seed layer 154, and the photoresist is patterned with a desired pattern for the through-vias 120. The photoresist may be patterned using lithography, by exposing the photoresist to light or energy reflected from or transmitted through a lithography mask (not shown) having a desired pattern thereon. The photoresist is then developed, and then exposed portions (or unexposed portions, depending on whether the photoresist comprises a positive or negative photoresist) of the photoresist are then ashed or etched away, leaving patterns in the photoresist. The photoresist is then used as a mask during an electro-chemical plating (ECP) or electro-plating process that is used to form the through-vias 120 through the patterned photoresist over the seed layer 154. The photoresist is then removed, leaving the through-vias 120 disposed over the seed layer 154, as shown in FIG. 17.

Figure 18:
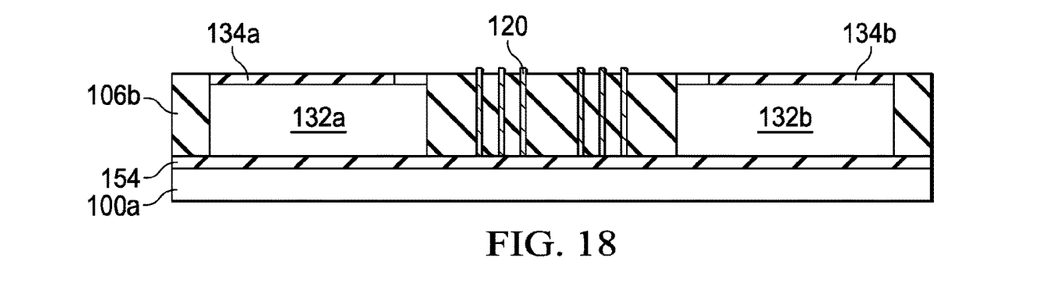
Figure 19:
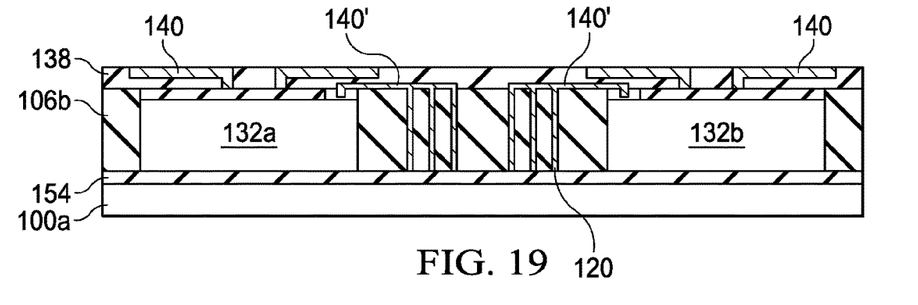

The plurality of second dies 132a and 132b are then coupled to the first carrier 100a over the seed layer 154, as shown in FIG. 18. The plurality of second dies 132a and 132b are coupled to the carrier 100a with an adhesive or glue, for example. A molding compound 106b is then formed between the second dies 132a and 132b, between the through-vias 120, and between the second dies 132a and 132b and the through-vias 120, also shown in FIG. 18. The through-vias 120 are thus disposed in the molding compound 106b and are disposed between the plurality of second dies 132a and 132b. The insulating material 138 and interconnects 140 and 140' are formed over the second dies 132a and 132b and the through-vias 120 disposed in the molding compound 106b, as shown in FIG. 19.

Figure 20:
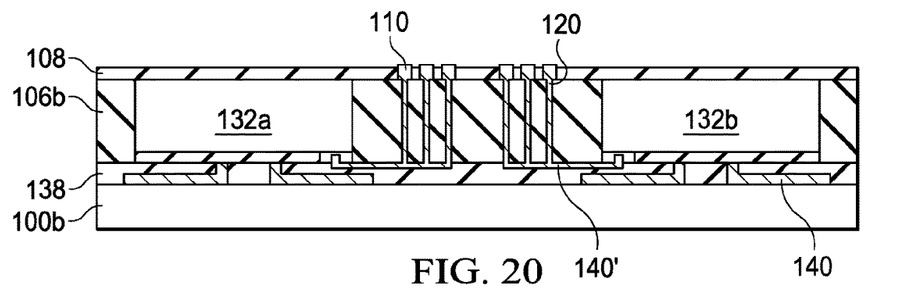

The first carrier 100a is then removed, as shown in FIG. 20, and the semiconductor device is inverted. A second carrier 100b is then coupled to the insulating material 138 and interconnects 140 (e.g., which comprise horizontal electrical connections), also shown in FIG. 20. The seed layer 154 is then removed, and insulating material 108 and interconnects 110 are formed over the second dies 132a and 132b, the through-vias 120, and the molding compound 106b, also shown in FIG. 20. The interconnects 110 are electrically coupled to the through-vias 120, for example.

Figure 21:
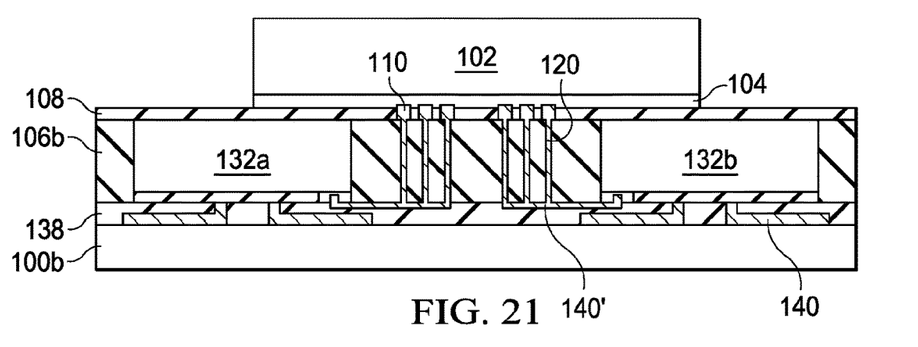

The first die 102 is then coupled to the second dies 132a and 132b and the through-vias 120, as shown in FIG. 21. Portions of the first die 102 are electrically coupled to the through-vias 120. The input/output region 104 of the first die 102 is electrically coupled to the through-vias 120 by interconnects 110, for example.

Figure 22:
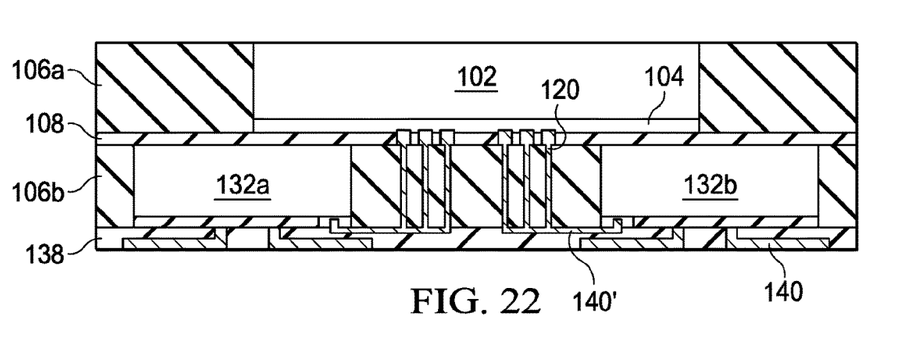
Figure 23:
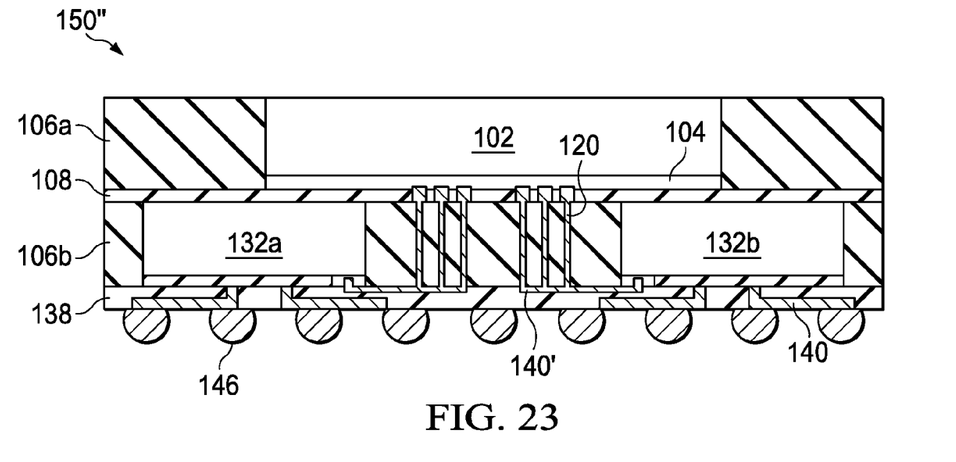
Figure 24:
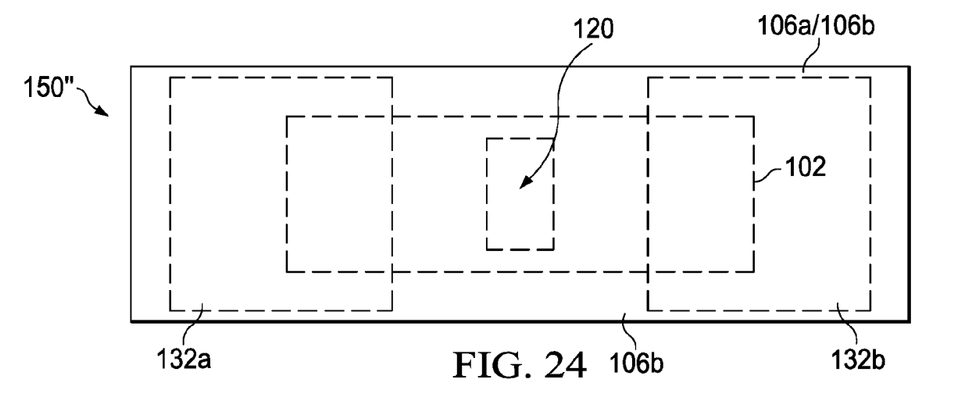
FIG. 24 is a top view of the packaged semiconductor device shown in FIG. 23.

A molding compound 106a is formed over and around the first die 102, and the second carrier 100b is removed, as shown in FIG. 22. In some embodiments, connectors 146 are formed on portions of the interconnects 140, as shown in FIG. 23. The connectors 146 are coupled to portions of the horizontal electrical connections formed by the interconnects 140 in some embodiments, for example. A plurality of the packaged semiconductor devices 150" may be singulated by separating them along a scribe line using a die saw, in some embodiments. FIG. 24 is a top view of the packaged semiconductor device 150" shown in FIG. 23.

Figure 25:
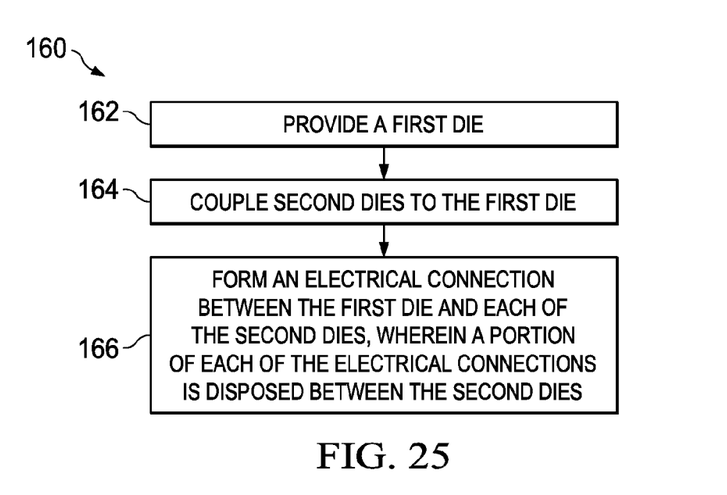
FIG. 25 is a flow chart of a method of packaging semiconductor devices in accordance with some embodiments.

FIG. 25 is a flow chart 160 of a method of processing a semiconductor device in accordance with some embodiments. In step 162, a first die 102 is provided (see also FIG. 1). In step 164, second dies 132a and 132b are coupled to the first die 102 (FIG. 4). In step 166, an electrical connection is formed between the first die 102 and each of the second dies 132a and 132b, wherein a portion of each of the electric connections is disposed between the second dies 132a and 132b (FIG. 4).

Some embodiments of the present disclosure comprise design methods for packaged semiconductor devices 150, 150', or 150". For example, a first die design is provided, and a second die design is provided. A second die of the second die design is adapted to be stacked onto a first die 102 of the first die design. The second die design is partitioned into a design for a plurality of second dies 132a and 132b. Electrical connections for the packaged semiconductor device 150, 150', or 150" are then designed. The electrical connections comprise the through-vias 120 and the interconnects 140 and 140' in some embodiments. Designing the electrical connections comprises designing horizontal electrical connections comprising the interconnects 140 and 140' that are coupleable to the plurality of second dies 132a and 132b. Designing the electrical connections further comprises designing vertical electrical connections comprising the through-vias 120 that are coupleable between the horizontal connections comprising the interconnects 140 and 140' and the first die 102. The vertical connections comprising the through-vias 120 are disposable between two of the plurality of second dies 132a and 132b. Designing the vertical electrical connections comprises designing a plurality of through-vias 120 disposed in the molding compound 106b, as shown in FIG. 23, designing a third die 122 comprising a plurality of through-vias 120, as shown in FIG. 7, or designing an interposer 152 comprising a plurality of through-vias 120, as shown in FIG. 15.

Advantages and benefits of some embodiments of the present disclosure include providing novel packaged semiconductor devices 150, 150', and 150" that include through-vias 120 disposed between second dies 132a and 132b that are stacked within a package with first dies 102. A second die design is partitioned, and a plurality of second dies 132a and 132b that are adapted to perform the original second die design function are fabricated and packaged with a first die 102. Low cost through-vias 120 are then inserted between the plurality of second dies 132a and 132b, which provide electrical connections having a short distance and high input/output connections. The through-vias 120 may comprise through-substrate vias formed in a third die 122 or an interposer 152, or through-molding 106b vias in accordance with some embodiments. Low cost third dies 122 and low cost interposers 152 may be used to provide the through-vias 120.

In embodiments wherein the through-vias 120 are preformed in a third die 122 or an interposer 152, the through-vias 120 can advantageously be pre-tested before assembly (e.g., before the packaging process), resulting in increased manufacturing yields for the packages semiconductor devices 150 and 150'. The through-vias 120 provide a shorter distance electrical connection than horizontal electrical connections in some embodiments, provided a shortest distance for electrical connections in the packaged semiconductor devices 150, 150', and 150".

Packages for semiconductor devices are provided that have a decreased cost and improved electrical performance due to the shortened electrical connections provided by the through-vias 120 disposed between the second dies 132a and 132b. Costs to manufacture the first dies 102 and/or the second dies 132a and 132b are decreased in some embodiments, by avoiding a need to form through-substrate vias in the first dies 102 and/or the second dies 132a and 132b. The use of die area on the first dies 102 and/or the second dies 132a and 132b is reduced, by avoiding the need to form through-substrate vias in the first dies 102 and/or the second dies 132a and 132b in some embodiments, for example. Placing the through-vias 120 in a central region of the packaged semiconductor devices 150, 150' and 150" results in reduced overall stress on the packages. Furthermore, the novel packaging systems and process flows described herein are easily implementable in semiconductor device packaging systems and process flows.

In some embodiments, a method of packaging a plurality of semiconductor devices includes providing a first die, and coupling a plurality of second dies to the first die. An electrical connection is formed between the first die and each of the plurality of second dies. A portion of each of the electrical connections is disposed between the plurality of second dies.

In some embodiments, a packaged semiconductor device includes a first die and a plurality of second dies disposed over the first die. A plurality of electrical connections is disposed between the first die and each of the plurality of second dies. A portion of each of the plurality of electrical connections is disposed between the plurality of second dies.

In some embodiments a design method for a packaged semiconductor device includes providing a first die design, and providing a second die design. A second die of the second die design is adapted to be stacked onto a first die of the first die design. The second die design is partitioned into a design for a plurality of second dies. The method includes designing electrical connections for the packaged semiconductor device. Designing the electrical connections comprises designing horizontal electrical connections coupleable to the plurality of second dies, and designing vertical electrical connections coupleable between the horizontal connections and the first die. The vertical connections are disposable between two of the plurality of second dies, in some embodiments.

In some embodiments, a packaged semiconductor device includes a first die having a major surface and having an outermost periphery. A second die is mounted on the major surface of the first die, the second die partially overlapping within the outermost periphery and partially extending beyond the outermost periphery at a first side of the major surface. Another second die is mounted on the major surface of the first die, the another second die partially overlapping within the outermost periphery and partially extending beyond the outermost periphery at a second side of the major surface opposite the first side of the major surface. An electrical interconnect structure is disposed between the first die and the second die and the another second die, the electrical interconnect structure extending at least partially in a direction orthogonal to the major surface of the first die and being disposed between the second die and the another second die.

In some embodiments, a packaged semiconductor device includes a first die having a footprint in a top-down view. A plurality of second dies is coupled to the first die, wherein a first one of the plurality of second dies is offset from the first die such that a first portion of the first one of the plurality of second dies overlaps the footprint of the first die at a first side of the first die and a second portion of the first one of the plurality of second dies extends outside the footprint of the first die at the first side of the first die. A second one of the plurality of second dies is offset from the first die such that a first portion of the second one of the plurality of second dies overlaps the footprint of the first die at a second side of the first die, the second side opposite the first side, and a second portion of the second one of the plurality of second dies extends outside the footprint of the first die at the second side of the first die. Through vias are disposed over the first die, the through vias being between the first one of the plurality of second dies and the second one of the plurality of second dies, the through vias extending in a direction orthogonal to a major surface of the first die In some embodiments a design method for a packaged semiconductor device includes coupling two second dies to a plurality of through vias, wherein the two second dies are laterally spaced from respective sides of the plurality of through vias. A first molding compound is formed on sidewalls of the two second dies and on sidewalls of the plurality of through vias. An insulating material and first interconnects are formed over the two second dies. A first die having an input/output region is coupled to the two second dies, wherein the input/output region is electrically coupled to the plurality of through vias by second interconnects. A second molding compound is formed on sidewalls of the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A packaged semiconductor device, comprising:
   a first die having a major surface and having an outermost periphery;
   a single insulating layer having a first major surface and a second major surface opposite the first major surface, the first major surface in contact with the major surface of the first die;
   a second die mounted in contact with the second major surface of the single insulating layer, the second die partially overlapping within the outermost periphery and partially extending beyond the outermost periphery at a first side of the major surface;
   another second die mounted in contact with the second major surface of the single insulating layer, the another second die partially overlapping within the outermost periphery and partially extending beyond the outermost periphery at a second side of the major surface opposite the first side of the major surface;
   an electrical interconnect die disposed between the second die and the another second die, the electrical interconnect die extending at least partially in a direction orthogonal to the major surface of the first die and being disposed between the second die and the another second die, the electrical interconnect die being in contact with the second major surface of the single insulating layer, wherein the electrical interconnect die is narrower than the first die in a first direction, and the electrical interconnect die is wider than the first die in a second direction, the first direction being perpendicular to the second direction, the first direction and the second direction being parallel to the first major surface of the single insulating layer;
   first interconnects electrically connecting the electrical interconnect die to the first die, the first interconnects disposed in a first portion of the single insulating layer, the first portion of the single insulating layer being laterally disposed between the second die and the another second die, wherein portions of the single insulating layer besides the first portion of the single insulating layer are free from conductive features;
   a first molding compound encapsulating the outermost periphery of the first die, the first molding compound being different from the single insulating layer; and
   a second molding compound encapsulating the outermost periphery of the second die, the another second die, and the electrical interconnect die,
   wherein outermost extents of the first molding compound, the second molding compound, and the single insulating layer are laterally coterminous.

2. The packaged semiconductor device of claim 1, wherein the electrical interconnect die comprises through vias extending through a substrate and a dielectric layer, the dielectric layer contacting a portion of the second molding compound.

3. The packaged semiconductor device of claim 1, wherein the electrical interconnect die comprises through vias extending through an interposer.

4. The packaged semiconductor device of claim 1, further comprising:
   a redistribution layer comprising a second insulating layer and a plurality of second interconnects in the second insulating layer, the second interconnects being disposed over the second die and the another second die, the second insulating layer contacting the second die, the another second die, the electrical interconnect die, and the second molding compound, wherein the second die, the another second die, the electrical interconnect die, and the second molding compound extend from the single insulating layer to the second insulating layer, wherein a first subset of the second interconnects extend along and contact a surface of the electrical interconnect die, a surface of the second die, and a surface of the another second die; and
   a plurality of connectors coupled to a second subset of the second interconnects, the second subset of the second interconnects being larger than the first subset of the second interconnects.

5. The packaged semiconductor device of claim 4, wherein the second interconnects comprise horizontal electrical connections coupled to the electrical interconnect die.

6. The packaged semiconductor device of claim 4, wherein the second insulating layer and the second interconnects comprise fan-out regions.

7. The packaged semiconductor device of claim 1, wherein the single insulating layer has a portion extending contiguously from the outermost periphery of the first die to an outermost periphery of the single insulating layer.

8. The packaged semiconductor device of claim 1, wherein a surface of the first molding compound is planar with the major surface of the first die, and wherein a surface of the second molding compound is planar with a major surface of the second die, a major surface of the another second die, and a major surface of the electrical interconnect die.

9. The packaged semiconductor device of claim 1, wherein the first die is a memory die, the electrical interconnect die is an interposer, and the second die and the another second die are processor dies.

10. A packaged semiconductor device, comprising:
    a first die having a footprint in a top-down view, the first die having a longitudinal axis in a first direction;
    a first dielectric layer having a first major surface and a second major surface opposite the first major surface, the first major surface of the first dielectric layer contacting the first die;
    a plurality of second dies contacting the second major surface of the first dielectric layer, wherein:
      a first one of the plurality of second dies is offset from the first die such that a first portion of the first one of the plurality of second dies overlaps the footprint of the first die at a first side of the first die and a second portion of the first one of the plurality of second dies extends outside the footprint of the first die at the first side of the first die; and
      a second one of the plurality of second dies is offset from the first die such that a first portion of the second one of the plurality of second dies overlaps the footprint of the first die at a second side of the first die, the second side opposite the first side, and a second portion of the second one of the plurality of second dies extends outside the footprint of the first die at the second side of the first die;

an interposer contacting the second major surface of the first dielectric layer, the interposer comprising a plurality of through vias, the through vias being between the first one of the plurality of second dies and the second one of the plurality of second dies, the through vias extending in a direction orthogonal to a major surface of the first die, respective through vias extending at least from a plane of the topmost surface of the first one of the plurality of second dies to a plane of the bottommost surface of the first one of the plurality of second dies, the interposer and the plurality of second dies each having longitudinal axes in a same second direction, the first direction being perpendicular to the second direction, the first direction and the second direction being parallel to the first major surface of the first dielectric layer;

first interconnects underlying and in contact with the through vias, the first interconnects extending through a first portion of the first dielectric layer, the first portion of the first dielectric layer surrounded by a second portion of the first dielectric layer, the second portion of the first dielectric layer extending from the first portion of the first dielectric layer to outside of the footprint of the first die, the second portion of the first dielectric layer being free from interconnects;

a first molding compound contacting the first major surface of the first dielectric layer and sidewalls of the first die, the first molding compound formed of a different material than the first dielectric layer;

a second molding compound contacting the second major surface of the first dielectric layer, sidewalls of the second dies, and sidewalls of the interposer, the second molding compound formed of a different material than the first dielectric layer; and a redistribution layer comprising a second dielectric layer and a plurality of second interconnects in the second dielectric layer, the second dielectric layer contacting the second molding compound, the interposer, and the plurality of second dies, wherein the first interconnects, the through vias of the interposer, and the second interconnects of the redistribution layer are electrically interposed between the first die and the plurality of second dies.

11. The packaged semiconductor device of claim 10, wherein the first die comprises an input output region along the major surface of the first die, the first interconnects laterally confined to the input output region.

12. The packaged semiconductor device of claim 11, wherein the first interconnects are in contact with the input output region.

13. The packaged semiconductor device of claim 10, wherein the second interconnects are overlying and in contact with the through vias, further comprising:
conductors coupled to the second interconnects.

14. The packaged semiconductor device of claim 10, wherein the first dielectric layer physically separates the second molding compound from the first molding compound.

15. The packaged semiconductor device of claim 10, wherein the second portion of the first dielectric layer extends contiguously from the first portion of the first dielectric layer to the outermost periphery of the first one of the plurality of second dies and the outermost periphery of the second one of the plurality of second dies.

16. A packaged semiconductor device comprising:
a third die having through vias passing therethrough;
two second dies coupled to the plurality of through vias, wherein the two second dies are laterally spaced from respective sides of the third die, each second die having a second input/output region, wherein the third die and the two second dies each have a same first width in a first direction;
a first molding compound on sidewalls of the two second dies, and on sidewalls of the third die;
a first insulating material and first interconnects over the two second dies and the third die, wherein the second input/output region of each second die faces towards the first insulating material, wherein a subset of the first interconnects extend along and contact a surface of the third die and a surface of the first molding compound;
a first die having a first input/output region, the first die being coupled to the two second dies, wherein the first input/output region is electrically coupled to the plurality of through vias by second interconnects, wherein the first input/output region of the first die faces towards the first insulating material, wherein the first die has a second width in the first direction, the second width being less than the first width;
a second molding compound on sidewalls of the first die; and
a dielectric layer having a first major surface and a second major surface opposite the first major surface, wherein the two second dies, the third die, and the first molding compound are disposed on the first major surface of the dielectric layer, wherein the first die and the second molding compound are disposed on the second major surface of the dielectric layer, the dielectric layer comprising a different material than the first molding compound and the second molding compound, the second interconnects disposed in a first portion of the dielectric layer, the first portion of the dielectric layer laterally confined to the first input/output region of the first die, wherein portions of the dielectric layer besides the first portion of the dielectric layer are free from interconnects, wherein the second interconnects extend into the first input/output region of the first die.

17. The packaged semiconductor device of claim 16, wherein a first portion of each of the two second dies overlaps an area of the first die on respective sides of the first die, and a second portion of each of the two second dies extends outside an outer perimeter of the first die on the respective sides of the first die.

18. The packaged semiconductor device of claim 17, wherein from a top-down view the plurality of through vias are formed in a central region of the first die between the first portions of the two second dies.

19. The packaged semiconductor device of claim 16, further comprising connectors on portions of the first interconnects.

20. The packaged semiconductor device of claim 16, wherein the first input/output region of the first die is laterally confined between the two second dies, and the through vias of the third die are laterally confined to the first input/output region of the first die.

* * * * *